US012777815B2

(12) United States Patent
Zhao

(10) Patent No.: US 12,777,815 B2
(45) Date of Patent: Oct. 27, 2026

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Chen Zhao, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1206 days.

(21) Appl. No.: 17/755,866

(22) PCT Filed: Apr. 20, 2022

(86) PCT No.: PCT/CN2022/087927
§ 371 (c)(1),
(2) Date: Oct. 19, 2023

(87) PCT Pub. No.: WO2023/197348
PCT Pub. Date: Oct. 19, 2023

(65) Prior Publication Data

US 2024/0155915 A1 May 9, 2024

(30) Foreign Application Priority Data

Apr. 12, 2022 (CN) ......................... 202210378528.7

(51) Int. Cl.
*H10K 59/80* (2023.01)
*H10K 59/60* (2023.01)
*H10K 102/00* (2023.01)

(52) U.S. Cl.
CPC ............. *H10K 59/87* (2023.02); *H10K 59/60* (2023.02); *H10K 2102/351* (2023.02)

(58) Field of Classification Search
CPC ......................... H10K 59/87; H10K 2102/351
(Continued)

(56) References Cited

U.S. PATENT DOCUMENTS

2019/0006615 A1* 1/2019 Jung ...................... H10K 59/40
2019/0115547 A1 4/2019 Lee et al.
2024/0373565 A1* 11/2024 Liu ......................... H05K 5/02

FOREIGN PATENT DOCUMENTS

CN 109345959 A 2/2019
CN 209607739 U 11/2019
(Continued)

OTHER PUBLICATIONS

Chinese Office Action issued in corresponding Chinese Patent Application No. 202210378528.7 dated May 15, 2025, pp. 1-8.
(Continued)

*Primary Examiner* — Igwe U Anya
(74) *Attorney, Agent, or Firm* — PV IP PC; Christopher S. Ruprecht; Wei Te Chung

(57) ABSTRACT

A display panel includes a substrate including a display region. The display region includes a deformation sub-region and a normal sub-region. A light-emitting layer is located at a side of the substrate opposite to the display region. A functional layer is located at a side of the substrate away from the light-emitting layer and includes a first functional part arranged opposite to the deformation sub-region and a second functional part arranged opposite to the normal sub-region. The elastic modulus of the first functional part is greater than that of the second functional part.

19 Claims, 7 Drawing Sheets

(58) Field of Classification Search
USPC ........................................................ 257/40
See application file for complete search history.

(56) References Cited

FOREIGN PATENT DOCUMENTS

| | | | | | |
|---|---|---|---|---|---|
| CN | 110610979 A | | 12/2019 | | |
| CN | 112164712 A | | 1/2021 | | |
| CN | 112991945 A | | 6/2021 | | |
| CN | 113629068 A | | 11/2021 | | |
| CN | 113658515 A | | 11/2021 | | |
| CN | 113744630 A | | 12/2021 | | |
| CN | 113767476 A | | 12/2021 | | |
| CN | 113986037 A | * | 1/2022 | ............. | B32B 15/08 |

OTHER PUBLICATIONS

International Search Report in International application No. PCT/CN2022/087927, mailed on Dec. 15, 2022.
Written Opinion of the International Search Authority in International application No. PCT/CN2022/087927, mailed on Dec. 15, 2022.

* cited by examiner

DISPLAY PANEL

BACKGROUND OF INVENTION

1. Field of Invention

The present application relates to the technical field of display, and more particularly, to the technical field of display panel manufacturing, in particular to a display panel.

2. Related Art

Organic light-emitting diode (OLED) displays have characteristics of high brightness, wide viewing angles, quick response times, being ultra-thin, and being light in weight, and may be made into flexible products.

Currently, in OLED flexible products, film layers of support panels will be deformed under the action of external force during manufacturing processes, and the deformation will be spread to panels. The panels manufactured by depolarizing technology cannot eliminate imprint phenomenon caused by the above deformation under irradiation of external light, which undermines the appearance of screens of OLED flexible products.

Therefore, current OLED flexible products made by depolarizing technology have a problem that the appearance of screens is undermined due to the deformation of the film layers of the support panels, which is in dire needs to be improved.

SUMMARY OF INVENTION

An objective of the present application is to provide a display panel, which solves a technical problem that appearance of a screen is undermined due to deformation of a film layer of a support panel encountered in current OLED flexible products manufactured by a depolarizing technology.

An embodiment of the present application provides a display panel including: a substrate including a display region, wherein the display region includes a deformation sub-region and a normal sub-region; a light-emitting layer located at one side of the substrate opposite to the display region; and a functional layer located at the side of the substrate away from the light-emitting layer, and including a first functional part arranged opposite to the deformation sub-region and a second functional part arranged opposite to the normal sub-region; wherein the elastic modulus of the first functional part is greater than that of the second functional part.

The present application has advantageous effects as follows: the present application provides a display panel which includes: a substrate including a display region, wherein the display region includes a deformation sub-region and a normal sub-region; a light-emitting layer located at one side of the substrate opposite to the display region; and a functional layer located at a side of the substrate away from the light-emitting layer and including a first functional part arranged opposite to the deformation sub-region and a second functional part arranged opposite to the normal sub-region. An elastic modulus of the first functional part is greater than that of the second functional part. In the present application, with the elastic modulus of the first functional part greater than that of the second functional part, under same stress, strain of the first functional part is less than that of the second functional part to produce less deformation, so as to improve the deformation of the functional layer caused by external force, thereby improving the appearance of the screen of the display panel.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments acquired by those skilled in the art without creative efforts shall be within the scope of the present application.

The terms "first" and "second", etc. in the present application are used to distinguish different objects, rather than to describe a specific processing order. In addition, the terms "include" and "comprise" and any variations thereof are intended to cover non-exclusive inclusion. For example, a process, method, system, product or device that includes a series of steps or modules is not limited to the listed steps or modules, but may also include steps or modules that are not listed, or alternatively include other steps or modules inherent to said process, method, product or device.

The term "embodiment" in the present application means that a specific feature, structure or characteristic described in connection with an embodiment may be included in at least one embodiment of the present application. The same term shown in different places in the specification does not necessarily refer to the same embodiment, nor is it an independent or alternative embodiment mutually exclusive with other embodiments. It is understood explicitly and implicitly by those skilled in the art that the embodiments described herein may be combined with other embodiments. In addition, it should be noted that the attached drawings only provide the structure closely related to the present application and may omit some minor details. The purpose is to simplify the attached drawings and make the inventive points easier to understand, and is not meant to suggest that the actual device is exactly the same as the attached drawings. Thus, the drawings are not used as a limitation of the actual device.

Figure 1:
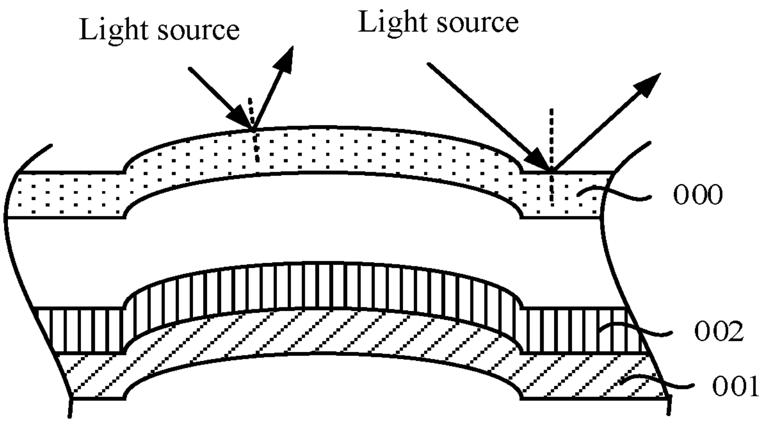
FIG. 1 (Prior Art)
FIG. 1 is a diagram illustrating a cross-sectional view of a conventional display panel adopting a depolarizing technology.

For organic light-emitting diode (OLED) flexible products manufactured by depolarizing technology, as shown in FIG. 1, any film layer of the panel 000 is subjected to the deformation caused by external force in a manufacturing process. Here, the deformation of the first film layer 001 at a bottom will be exerted onto the second film layer 002 above the first film layer 001, and the deformation will be gradually passed to the direction close to the panel layer. As a result, the panel 000 is deformed, and the above deformation will affect a transmission direction of light, resulting in great differences in reflection directions of light at different positions on the panel 000. However, because a polarizer is not arranged on the panel 000, the imprint phenomenon caused by the above deformation under the irradiation of external light cannot be eliminated, which undermines the appearance of a screen of the OLED flexible product. Based on the above technical problems, the present application provides the following technical solutions.

The present application provides a display panel, which includes, but is not limited to, the following embodiments and combinations of the following embodiments.

Figure 2:
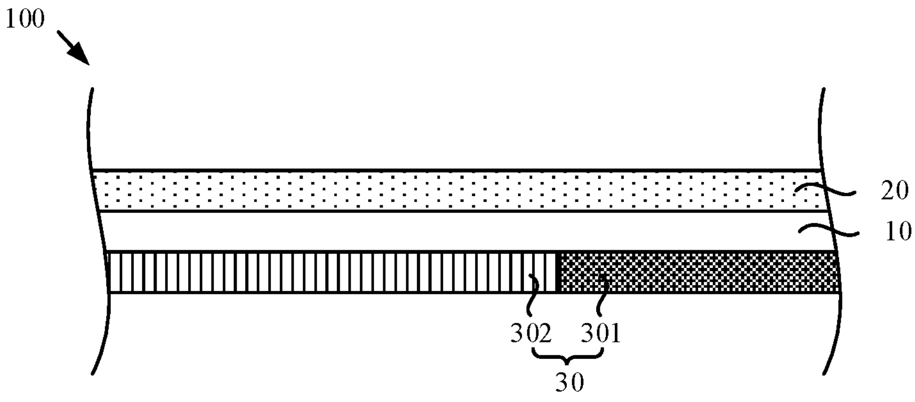
FIG. 2 is a diagram illustrating a cross-sectional view of a first type of display panel according to the embodiment of the present application.
Figure 3:
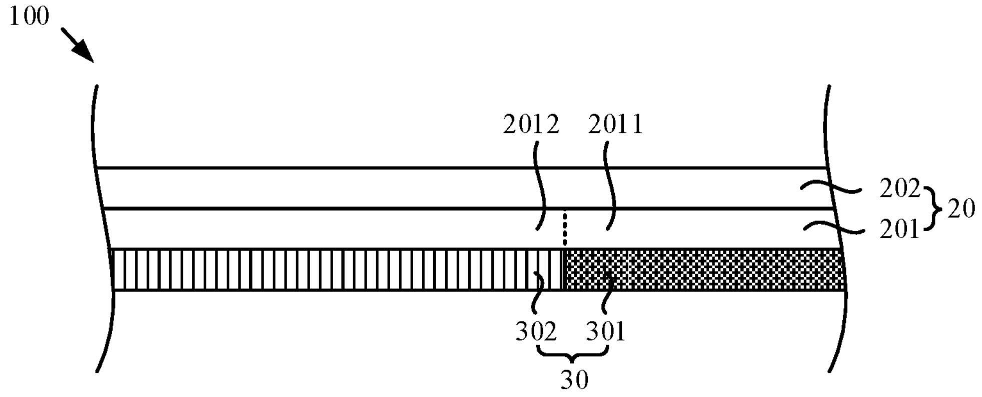
FIG. 3 is a diagram illustrating a cross-sectional view of a second type of display panel according to the embodiment of the present application.

In one embodiment, as shown in FIG. 2, the display panel 100 includes a support layer 10, a panel layer 20 located on one side of the support layer 10 near a light-emitting side of the display panel 100, and a functional layer 30 located on a side of the support layer 10 away from the panel layer 20 and including a first functional part 301 and a second functional part 302 which are arranged adjacent to each other. An elastic modulus of the first functional part 301 is greater than that of the second functional part 302. Specifically, as shown in FIG. 2 and FIG. 3, the panel layer 20 in the display panel 100 includes a substrate 201, a light-emitting layer 202, and a functional layer 30. The substrate 201 includes a display region, and the display region includes a deformation sub-region 2011 and a normal sub-region 2012. The light-emitting layer 202 is located on one side of the substrate 201 and opposite to the display region. The functional layer 30 is located on a side of the substrate 201 away from the light-emitting layer 202 and includes a first functional part 301 and a second functional part 302. The first functional part 301 is arranged opposite to the deformation sub-region 2011, and the second functional part 302 is arranged opposite to the normal sub-region 2012.

Specifically, one side of the panel layer 20 near the light-emitting side of the display panel 100 may be provided with a substrate, an array substrate layer, and a light-emitting layer. Specifically, the substrate may be a flexible substrate or a rigid substrate, a composition material of the flexible substrate may include but not limited to polyimide, and a composition material of the rigid substrate may include but not limited to silicon dioxide. The substrate may include a plurality of pixel circuit units, and the light-emitting layer may include a plurality of light-emitting parts corresponding to the plurality of pixel circuit units, respectively. The light-emitting parts emitting different colors form a light-emitting unit, and each pixel circuit unit is electrically connected to its corresponding light-emitting part to control the light-emitting conditions of the corresponding light-emitting parts, and the light-emitting conditions of the light-emitting units are jointly controlled by the light-emitting conditions of the corresponding light-emitting parts, so that the light-emitting units emit light to present the display screen of the display panel 100.

Specifically, the support layer 10 may be configured to support the panel layer 20, so as to prevent the film layer on the substrate in the display panel 100 from being unable to be supported due to insufficient hardness of the substrate, and the support layer 10 may be configured to protect the panel layer 20, so as to prevent an optical device from scratching the panel layer 20 during assembly process. Specifically, an elastic modulus of the support layer 10 may be greater than or equal to 2.5 gigapascals (GPa), and the composition material of the support layer 10 may include but not limited to polyethylene terephthalate, optical COP composition material, triacetate fiber film, and acrylic.

The functional layer 30 is located at a bottom of the display panel 100. For example, the functional layer 30 can perform heat dissipation on the panel layer 20 to protect the device from being damaged by heat accumulation. Specifically, an anti-deformation ability of the composition material refers to its ability to resist external forces without deformation, e.g., the degree of deformation of the composition material under unit stress. The less the deformation amount is, the stronger the anti-deformation ability of the composition material is, which may be presented by elastic modulus. In an elastic deformation stage, the stress and strain of an object are positively proportional, and a ratio coefficient thereof is called elastic modulus. It should be noted that the functional layer 30 is located at the bottom of the display panel 100, and the hardness and elastic modulus of the composition material of the functional layer 30 are generally small. Thus, the probability of the functional layer 30 being subjected to external force is high. As may be concluded from the above, the corresponding strain of the functional layer 30 under equal stress is higher, and the probability of being stressed is also higher, that is, the probability of deformation of the functional layer 30 is higher.

It may be understood that in this embodiment, the elastic modulus of different regions in the functional layer 30 is set to be different, and the elastic modulus of the adjacent first functional part 301 and the elastic modulus of the second functional part 302 are set to be different. For example, the elastic modulus of the first functional part 301 may be greater than that of the second functional part 302. As may be concluded from the above, the strain of the first functional part 301 may be less than that of the second functional part 302 under equal stress. Therefore, the distribution of the first functional part 301 and the second functional part 302 in the functional layer 30 may be reasonably arranged according to actual situations, so as to improve the deformation of the functional layer 30 due to external force and improve the appearance of the screen of the display panel 100.

In one embodiment, the support layer 10 includes polyimide to further support the panel layer 20. Specifically, the display panel 100 may further include a cover plate located on the side of the panel layer 20 away from the support layer 10, and an adhesive layer located between the cover plate and the panel layer 20. A composition material of the cover plate layer includes but is not limited to polycarbonate, and a composition material of the adhesive layer includes but is not limited to the optical adhesive.

Figure 4:
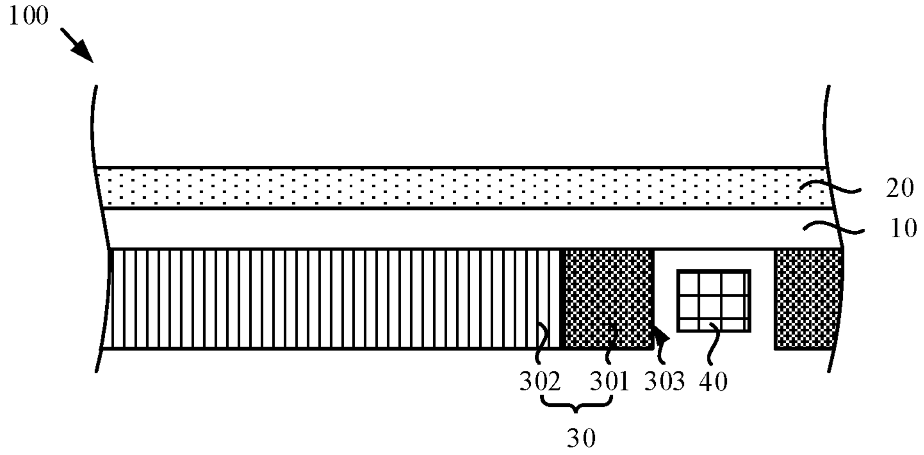
FIG. 4 is a diagram illustrating a cross-sectional view of a third type of display panel according to the embodiment of the present application.

In one embodiment, as shown in FIG. 4, the display panel 100 further includes a photosensitive device 40, a first through hole 303 formed in the first functional part 301, and a photosensitive device 40 located in the first through hole 303. The first through hole 303 may or may not pass through the first functional part 301. After the first functional part 301 including the first through hole 303 is formed on the side of the support layer 10 away from the panel layer 20, the photosensitive device 40 is fixed in the first through hole 303. The present application does not restrict the timing of forming the first through hole 303. Further, the display panel 100 may further include a housing for accommodating the photosensitive device 40, the support layer 10, the panel layer 20, and the functional layer 30, and the photosensitive device 40 may also be fixed to the housing.

Specifically, the photosensitive device 40 may be used for, but not limited to, fingerprint identification and photographing, and the number and size of the first through holes 303 are not limited in the present application. For example, the number of first through holes 303 may be equal to the number of photosensitive devices 40. Certainly, when there are at least two photosensitive devices 40 in the first through holes 303, the number of first through holes 303 may be less than the number of photosensitive devices 40. For example, the size of the first through hole 303 may be larger than that of the photosensitive device 40, that is, the first functional part 301 may surround the photosensitive device 40, so as to prevent the light irradiated around the photosensitive device 40 from being received by the photosensitive device 40, and to prevent external impurities from falling on the photosensitive device 40 during the working process. Furthermore, the thickness of the first functional part 301 may be greater than or equal to that of the photosensitive device 40, so as to prevent the bottom of the photosensitive device 40 from being scratched by the shell of the display panel 100.

It should be noted that in a process of forming the first through hole 303 in the first functional part 301, and in a process of forming the first functional part 301 including the first through hole 303 on the support layer 10, if the elastic modulus of the first functional part 301 is small, the stress distribution around the first through hole 303 will be dense, resulting in more serious deformation around the first through hole 303. It may be understood that in this embodiment, the first through hole 303 is provided in the first functional part 301 which has higher elastic modulus among the functional layer 30. When the stress distribution around the first through hole 303 in the whole functional layer 30 is dense, the elastic modulus of the first functional part 301 is greater than that of the second functional part 302, so that the large deformation around the first through hole 303 may be prevented, thus preventing the appearance of the display panel 100 from being undermined due to the provision of the first through hole 303.

Figure 5:
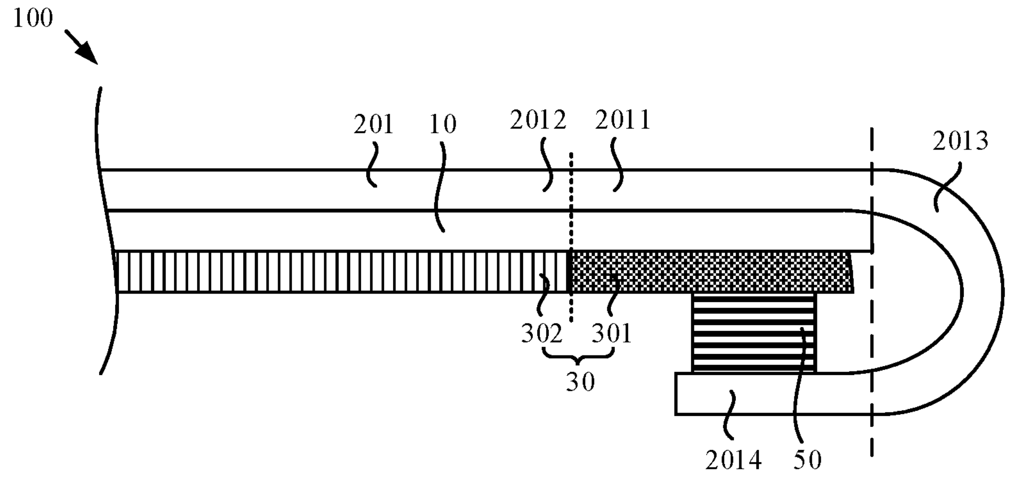
FIG. 5 is a diagram illustrating a cross-sectional view of a fourth type of display panel according to the embodiment of the present application.

In one embodiment, as shown in FIG. 5, the display panel 100 further includes a fixing layer 50, which is bent from a side of the functional layer 30 close to the light-emitting side of the display panel 100 to a side of the functional layer 30 away from the light-emitting side of the display panel 100, and fixed to the side of the functional layer 30 away from the light-emitting side of the display panel 100 by the fixing layer 50. The first functional part 301 is arranged at least opposite to the fixing layer 50. Specifically, as shown in FIG. 3 and FIG. 5, the substrate 201 further includes a non-display region, which includes a bent sub-region 2013 and a terminal sub-region 2014, wherein the terminal sub-region 2014 is arranged in a part of the bent sub-region 2013 away from the display region. The terminal sub-region 2014 is fixed on the side of the functional layer 30 away from the light-emitting layer 202 through the bent sub-region 2013, and the bent sub-region 2013 overlaps with the deformation sub-region 2011.

Specifically, upper and lower sides of the fixing layer 50 may be connected to one side of the functional layer 30 and one side of the panel layer 20, respectively, to remain a curved shape of the panel layer 20. Furthermore, in order to improve the stability of the bending form of the panel layer 20, a thickness of the fixing layer 50 may be equal to a distance between the side of the functional layer 30 and the side of the panel layer 20. Specifically, the fixing layer 50 can include a substrate layer and adhesive layers located on both sides of the substrate layer, wherein the substrate layer may be made of polyester resin or foam plastic, and the adhesive layers may be made of photocurable adhesive, epoxy adhesive, anaerobic adhesive, hot melt adhesive, pressure sensitive adhesive, or latex, etc.

It should be noted that under a flat state of the panel layer 20, one side of the fixing layer 50 may be fixed to the side of the panel layer 20 away from the light-emitting side of the display panel 100, and then the panel layer 20 is bent to the side of the functional layer 30 away from the light-emitting side of the display panel 100, so that the other side of the fixing layer 50 contacts the side of the functional layer 30 away from the light-emitting side of the display panel 100. Then, external force is applied to fix the other side of the fixing layer 50 to the functional layer 30. If the elastic modulus of the first functional part 301 is small, the part of the first functional part 301 opposite to the fixing layer 50 will be greatly deformed in this process. It may be understood that, in this embodiment, the first functional part 301 with higher elastic modulus among the functional layer 30 is arranged at least opposite to the fixing layer 50. When the other side of the fixing layer 50 is fixed to the functional layer 30, since the elastic modulus of the first functional part 301 is greater than that of the second functional part 302, the part of the first functional part 301 opposite to the fixing layer 50 may be prevented from being deformed severely, thus solving the problem that the appearance of the display panel 100 is undermined due to the other side of the fixing layer 50 being fixed to the functional layer 30.

Figure 6:
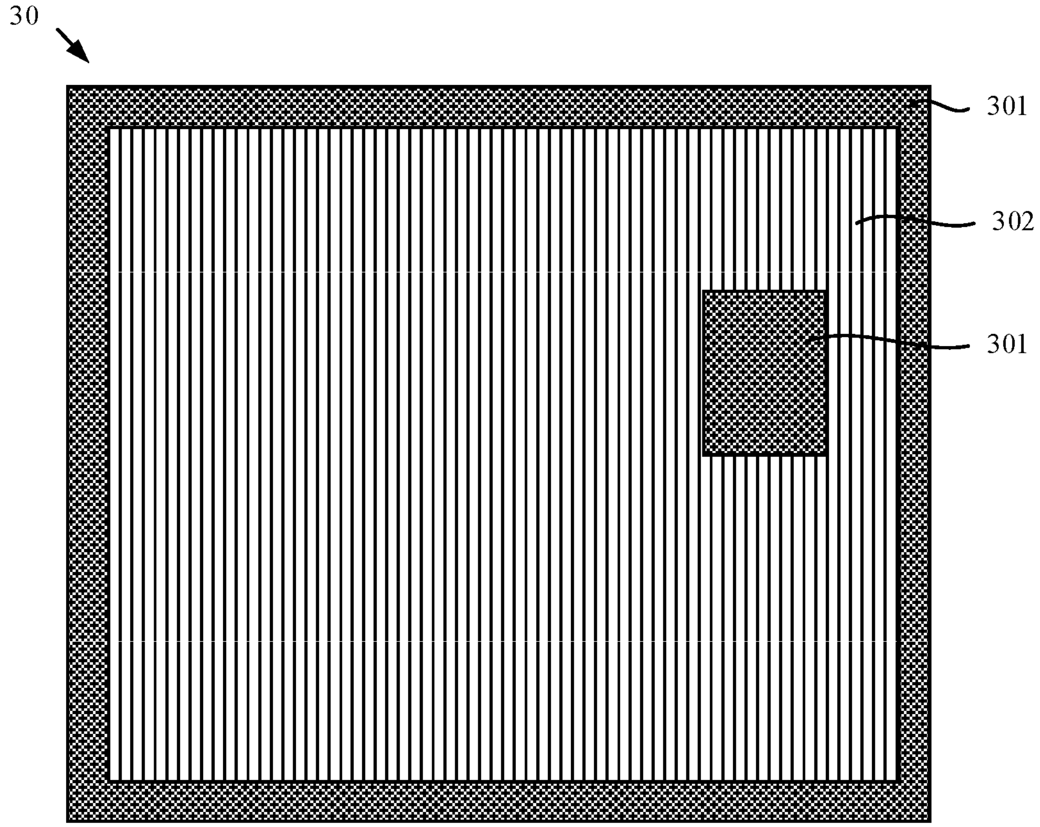
FIG. 6 is a diagram illustrating a top/bottom view of a functional layer according to an embodiment of the present application.

Accordingly, the present application does not limit that the first through hole 303 is provided on at least the side of the first functional part 301 away from the panel layer 20, as well as that the first functional part 301 is arranged at least opposite to the fixing layer 50. It may be understood that for the functional layer 30, the first functional part 301 with high elastic modulus may be arranged in the region with high stress during the manufacturing or use of the display panel 100 so as to minimize the degree of deformation and improve the screen of the display panel 100. Furthermore, as shown in FIGS. 2 and 6, the first functional part 301 may be arranged at least opposite to the edge of the support layer 10. As may be concluded from the above, on the basis of arranging the first functional part 301 with high elastic modulus in the region with high stress during the manufacturing or use of the display panel 100, the first functional part 301 may be arranged opposite to the edge of the support layer 10 in this embodiment, so as to further improve the anti-deformation quality of the edge of the functional layer 30 and thereby raise the stability of the display panel.

In one embodiment, as shown in FIGS. 2 to 6, the elastic modulus of the first functional part 301 is greater than or equal to 100 GPa. Specifically, the yield strength of the first functional part 301 may be greater than or equal to 1000 megapascals (MPa), and the Vickers hardness of the first functional part 301 may be greater than or equal to 400 HV. For example, the composition material of the first functional part may include at least one of stainless steel, carbon fiber, or copper alloy, wherein the copper alloy may be made of copper doped with at least one of nickel and zinc. Compared with the yield strength, Vickers hardness, and elastic modulus of stainless steel and carbon fiber are relatively large, the yield strength, Vickers hardness, and elastic modulus of copper alloy are less but can still provide certain functions.

In one embodiment, as shown in FIGS. 2 to 6, the thermal conductivity of the second functional part 302 is greater than 200 watts/meter degrees, so as to realize the function of the display panel 100. Further, the elastic modulus of the second functional part 302 may be less than or equal to 70 GPa, the yield strength of the second functional part 302 may be less than or equal to 500 MPa, and the Vickers hardness of the second functional part 302 may be greater than or equal to 100 HV. Specifically, the composition material of the second functional part 302 may include at least one of copper or aluminum. For example, the second functional part 302 may be made of copper, and thermal conductivity of the second functional part 302 may be 380 watts/meter degrees.

Figure 7:
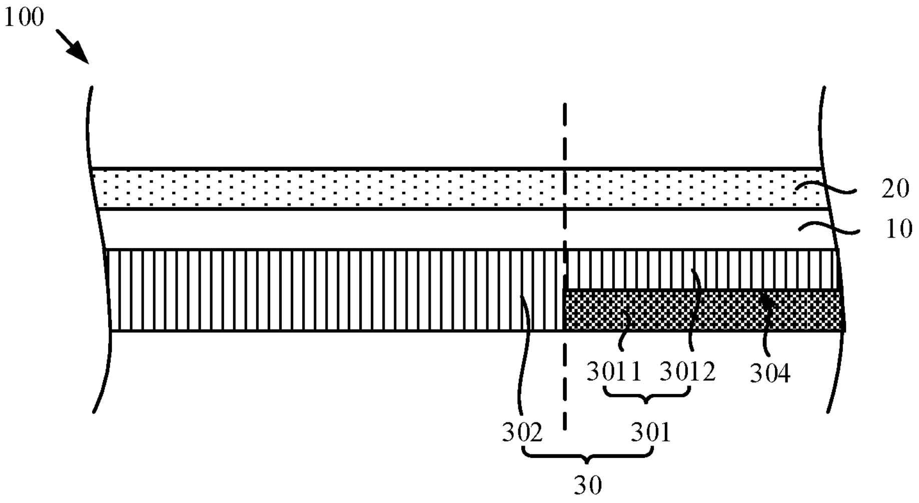
FIG. 7 is a diagram illustrating a cross-sectional view of a fifth type of display panel according to the embodiment of the present application.
Figure 8:
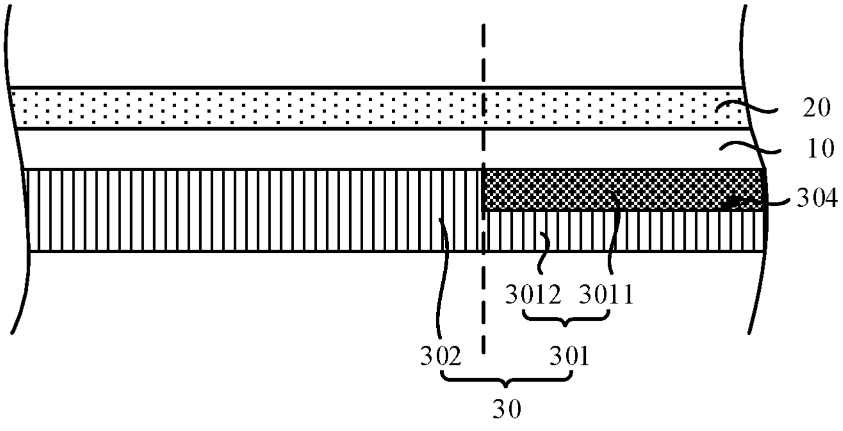
FIG. 8 is a diagram illustrating a cross-sectional view of a sixth type of display panel according to the embodiment of the present application.
Figure 9:
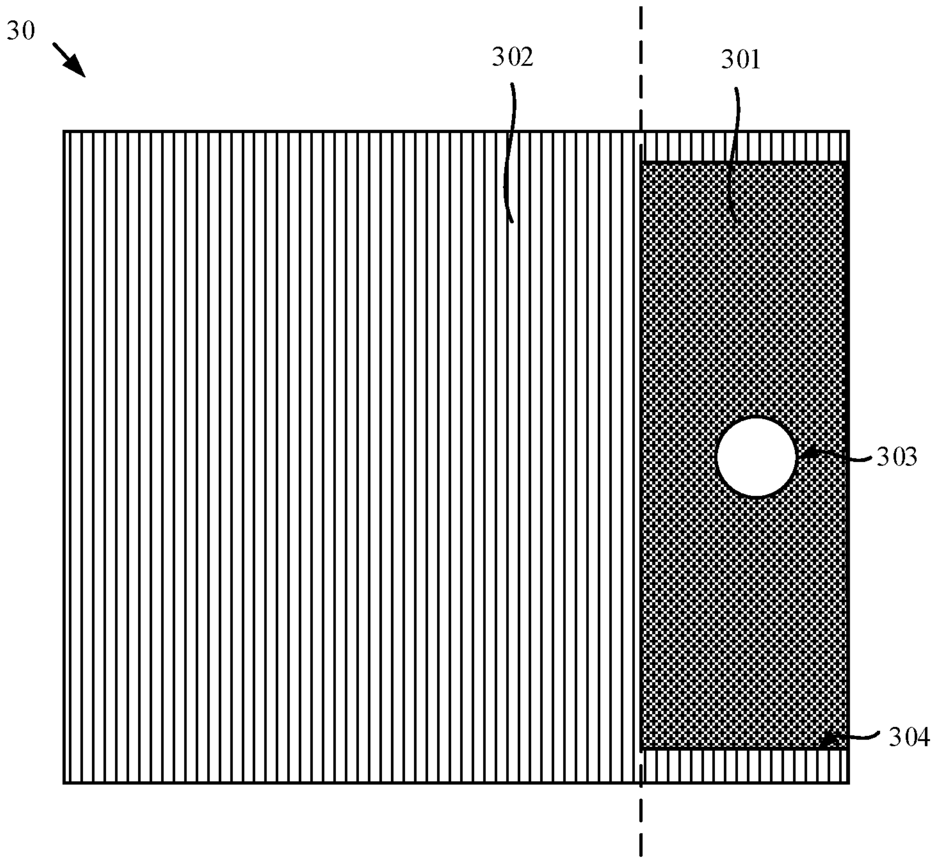
FIG. 9 is a diagram illustrating a top/bottom view of another functional layer according to the embodiment of the present application.

In one embodiment, referring to FIGS. 7 to 9, the first functional part 301 includes a first sub-functional layer 3011 and a second sub-functional layer 3012 which are arranged in a laminated manner, and the function coefficient of the second sub-functional layer 3012 is different from that of the first sub-functional layer 3011. Specifically, the present application does not limit the relative size relationship between the function coefficient of the second sub-functional layer 3012 and the function coefficient of the first sub-functional layer 3011. The sole purpose of the above illustration is to emphasize on the premise that the elastic modulus of the first functional part 301 is greater than that of the second functional part 302, the function coefficient of the second sub-functional layer 3012 and the function coefficient of the first sub-functional layer 3011 are different.

It may be understood that, in this embodiment, the function coefficients of the first sub-functional layer 3011 and the second sub-functional layer 3012 laminated in the first functional part 301 are differentiated, so as to prevent the situation where the first functional part 301 is made of the same composition material with high elastic modulus, which leads to a small function coefficient of the entire first functional part 301. For example, one of the function coefficients of the first sub-functional layer 3011 and the second sub-functional layer 3012 may be arranged larger than the other, to improve the overall function coefficient of the first functional part 301.

In one embodiment, referring to FIGS. 7 to 9, one of the first sub-functional layer 3011 and the second sub-functional layer 3012 has the same composition material as that of the second functional part 302, and the first sub-functional layer 3011 and the second sub-functional layer 3012 are integrally formed. As may be concluded from the above, the elastic modulus of the first functional part 301 is greater than that of the second functional part 302, and the function coefficient of the second sub-functional layer 3012 is different from that of the first sub-functional layer 3011. Furthermore, in this embodiment, the second sub-functional layer 3012 and the second functional part 302 can both be made of the composition material with elastic modulus equal to that of the second functional part 302 and relatively large function coefficient, or the first sub-functional layer 3011 and the second functional layer can both be made of the composition material with elastic modulus equal to that of the second functional part 302 and relatively large function coefficient, so as to reduce the manufacturing process, thus raising the manufacturing efficiency of the display panel 100.

This embodiment does not limit that the composition materials of certain one of the first sub-functional layer 3011 and the second sub-functional layer 3012 to be identical to the composition materials of the second functional part 302. The sole purpose of the above is to demonstrate that the composition materials of one of the first sub-functional layer 3011 and the second sub-functional layer 3012 is the same as that of the second functional part 302, and is integrated with the second functional part 302. Both the above two embodiments can improve the manufacturing efficiency of the display panel 100 on the basis of improving the function coefficient of the first functional part 301. Specifically, as shown in FIG. 7, the composition material of the second sub-functional layer 3012 located above the first sub-functional layer 3011 may be the same as that of the second functional part 302, is integrally with the second functional part 302. The composition material of the two may be referred to the above-mentioned description about the composition material of the second functional part 302. As shown in FIG. 8, the composition material of the first sub-functional layer 3011 located below the second sub-functional layer 3012 may be the same as that of the second functional part 302, and is integrated with the second functional part 302. The composition material of the two may be referred to the above description about the composition material of the second functional part 302.

Specifically, as shown in FIGS. 3, 7 to 9, the functional layer 30 includes: a first functional layer arranged at least opposite to the display region and including a first groove 304 arranged opposite to the deformation sub-region 2011; and a second functional layer filled in the first groove 304, wherein the elastic modulus of the second functional layer is greater than that of the first functional layer. The first functional part 301 includes a part of the first functional layer corresponding to the deformation sub-region 2011 and the second functional layer that are arranged in a laminated manner. As may be concluded from the above, the second functional part 302 and the second sub-functional layer 3012 constitute the first functional layer, and the first sub-functional layer 3011 is formed as the second functional layer. Further, the second functional part 302 and the second sub-functional layer 3012 in the first functional layer may be made of the same composition material to be integrally molded.

As shown in FIGS. 3, 7 to 9, the thickness of the part of the first functional layer opposite to the normal sub-region 2012 is greater than or equal to the thickness of the second functional layer. Specifically, as shown in FIG. 7 to FIG. 9, when the thickness of the part of the first functional layer opposite to the normal sub-region 2012 is greater than that of the second functional layer, the first groove 304 is formed by at least two adjacent sides of the first functional layer, as shown in FIG. 3 and FIG. 7 to FIG. 9. When the thickness of the part of the first functional layer opposite to the normal sub-region 2012 is equal to that of the second functional layer, it may be considered as that in the horizontal direction, the side of the first functional layer close to the second functional layer is provided with the above-mentioned first groove. Meanwhile, the first at which time the first functional layer may be considered as the second functional part 302, and the second functional layer may be considered as the first functional part 301. Furthermore, the thickness of the part of the first functional layer opposite to the normal sub-region ranges from 30 microns (μm) to 50 μm, and the thickness of the second functional layer ranges from 15 μm to 30 μm.

Figure 10:
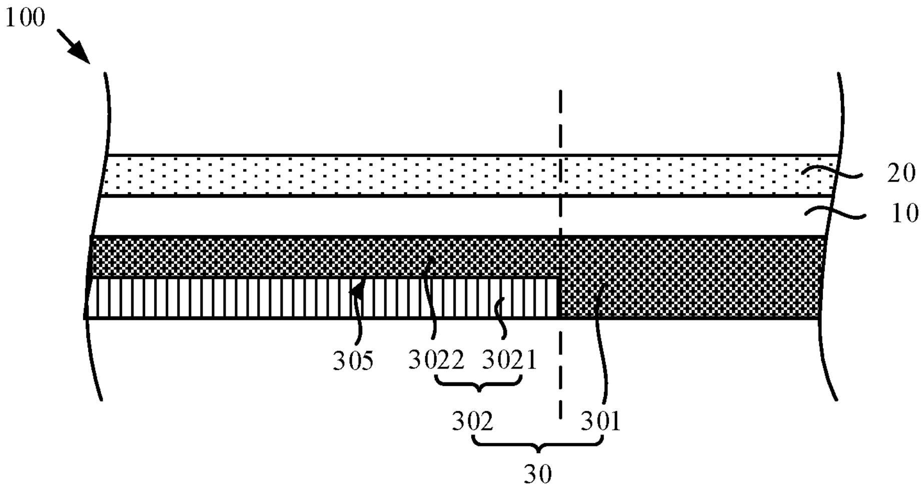
FIG. 10 is a diagram illustrating a cross-sectional view of a seventh type of display panel according to the embodiment of the present application.
Figure 11:
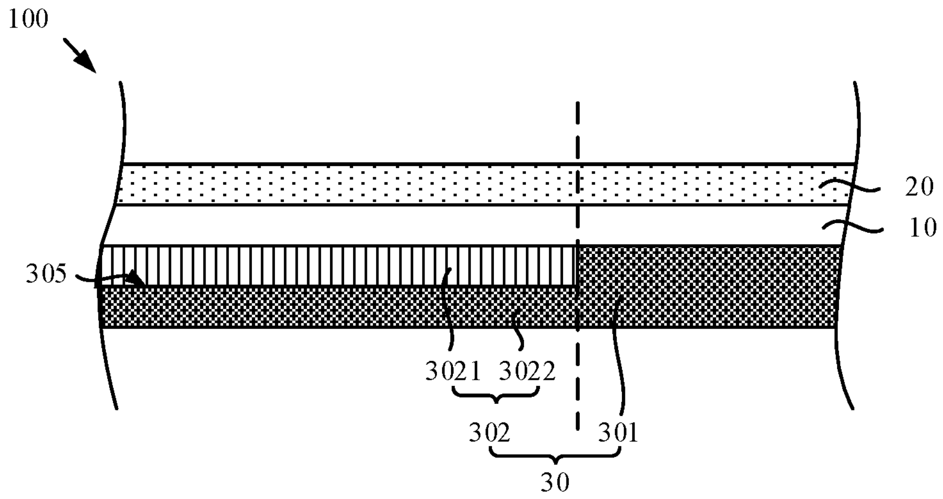
FIG. 11 is a diagram illustrating a cross-sectional view of an eighth type of display panel according to the embodiment of the present application.
Figure 12:
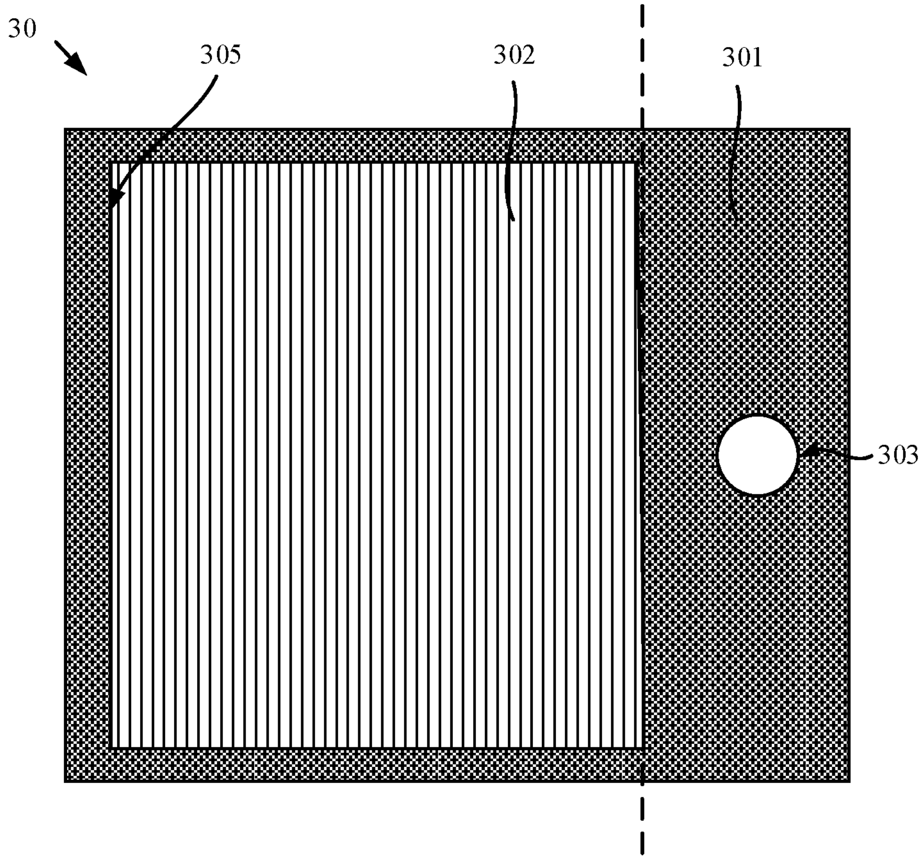
FIG. 12 is a diagram illustrating a top/bottom view of yet another functional layer according to the embodiment of the present application.

In one embodiment, as shown in FIGS. 10 to 12, the second functional part 302 includes a third sub-functional layer 3021 and a fourth sub-functional layer 3022 which are laminated, and the elastic modulus of the fourth sub-functional layer 3022 is different from that of the third sub-functional layer 3021. The composition material of one of the third sub-functional layer 3021 and the fourth sub-functional layer 3022 is the same as that of the first functional part 301, and is integrated with the first functional part 301.

Similarly, the relative relationship between the elastic modulus of the third sub-functional layer 3021 and the elastic modulus of the fourth sub-functional layer 3022 is not limited in the present application. The sole purpose of the above illustration is to emphasize on the premise that the elastic modulus of the first functional part 301 is greater than that of the second functional part 302, the function coefficient of the third sub-functional layer 3021 and the function coefficient of the fourth sub-functional layer 3022 are different. As can be seen from this embodiment, the elastic modulus of the first sub-functional layer 3011 and the second sub-functional layer 3012 laminated in the first functional part 301 are set differently, so as to prevent the situation where the first functional part 301 is made of the same composition material with larger function coefficient, which leads to relatively low elastic modulus of the entire first functional part 301 which thus failing to meet the hardness requirements of the display panel 100. For example, the elastic modulus of one of the third sub-functional layer 3021 and the fourth sub-functional layer 3022 may be set greater than that of the other, so as to increase the elastic modulus of the second functional part 302.

Furthermore, the composition material of one of the third sub-functional layer 3021 and the fourth sub-functional layer 3022 is the same as that of the first functional part 301, and is integrally with first functional part 301. That is, in this embodiment, through making the third sub-functional layer 3021 and the first functional part 301 at the same time (or through making the fourth sub-functional layer 3022 and the first functional part 301 at the same time) by selecting composition material with an elastic modulus equal to that of the first functional part 301, the process may be shortened, thus increasing the efficiency of manufacturing the display panel. Similarly, in this embodiment, there is no limitation on the composition material of which of the third sub-functional layer 3021 and the fourth sub-functional layer 3022 should be the same as the first functional part 301. Specifically, as shown in FIG. 10, the composition material of the fourth sub-functional layer 3022 may be the same as that of the first functional part 301, and is integrally with the first functional part 301. The composition material of both of the two can refer to the above illustration about the composition material of the second functional part 302. As shown in FIG. 11, the composition material of the third sub-functional layer 3021 may be the same as that of the first functional part 301, and is integrally with the first functional part 301, and the composition material of both of them may be referred to the above illustration about the composition material of the first functional part 301.

Specifically, as shown in FIGS. 3, 10 to 12, the functional layer 30 includes a first functional layer arranged opposite to the normal sub-region 2012; and a second functional layer arranged at least opposite to the display region, and including a second groove 305 arranged opposite to the normal sub-region 2012, wherein the second groove 305 is filled with the first functional layer, and the elastic modulus of the second functional layer is greater than that of the first functional layer. In addition, the second functional part includes the part of the first functional layer corresponding to the normal sub-region 2012, and the second functional layer which are laminated with the first functional layer. As may be concluded from the above, the first functional part 301 and the fourth sub-functional layer 3022 constitute the second functional layer, and the third sub-functional layer 3021 is formed as the first functional layer. Further, the first functional part 301 and the fourth sub-functional layer 3022 in the second functional layer may be made of the same composition material to be integrally molded.

As shown in FIGS. 3, 10 to 12, the thickness of the second functional layer opposite to the deformation sub-region 2011 is greater than that of the first functional layer. Specifically, as shown in FIG. 10 to FIG. 12, the second groove 305 is formed by at least two adjacent sides of the first functional layer. Since the elastic modulus of the second functional layer is greater than that of the first functional layer, the second functional layer with a higher elastic modulus is set to correspond to the display region in this embodiment, which can further improve the hardness of the display panel 100. Furthermore, the thickness of the second functional layer opposite to the deformation sub-region 2011 is 20 μm to 50 μm, and the thickness of the first functional layer is 10 μm to 30 μm.

In one embodiment, as shown in FIGS. 3, 7 to 12, the first functional layer includes at least one of copper or aluminum, and the second functional layer includes at least one of stainless steel or carbon fiber. Specifically, as shown in FIGS. 7 to 9, it can be concluded from the above discussion that the composition material of the second functional part 302 and the second sub-functional layer 3012 constituting the first functional layer includes at least one of copper or aluminum, and the composition material of the first sub-functional layer 3011 constituting the second functional layer includes at least one of stainless steel or carbon fiber. As shown in FIG. 10 to FIG. 12, it may be known from the above discussion that the composition material of the first functional part 301 and the fourth sub-functional layer 3022 constituting the second functional layer includes at least one of stainless steel or carbon fiber, and the composition material of the third sub-functional layer 3021 that forms the first functional layer includes at least one of copper or aluminum.

Specifically, referring to FIGS. 7 to 9, the sum of the thickness of the first sub-functional layer 3011 and the thickness of the second sub-functional layer 3012 is equal to the thickness of the second functional part 302. Specifically, the first groove 304, the second functional part 302, and the second sub-functional layer 3012 may be formed on one side of a copper film layer made of copper and with uniform thickness by patterning through etching, and then a stainless steel film layer made of stainless steel may be formed as the first sub-functional layer 3011 in the first groove 304 by bonding. A thickness of the copper film may range from 30 μm to 50 μm, a thickness of the stainless steel film may range from 15 μm to 30 μm, that is, the thickness of the second functional part 302 may be 30 μm to 50 μm, and the thickness of the first sub-functional layer 3011 may be 15 μm to 30 μm. The photosensitive device 40 and the fixing layer 50 may be arranged close to the same end of the display panel 100. Furthermore, as shown in FIG. 9, the first groove 304 formed on one side of the copper film layer may be arranged at least opposite to the photosensitive device 40 and the fixing layer 50 in the display panel 100, and the same first functional part 301 may be formed on the photosensitive device 40 and the fixing layer 50 at the same time.

Specifically, referring to FIGS. 10 to 12, the sum of the thickness of the third sub-functional layer 3021 and the thickness of the fourth sub-functional layer 3022 may be equal to the thickness of the first functional part 301. Specifically, the second groove 305, the first functional part 301, and the fourth sub-functional layer 3022 may be formed by patterning on one side of a stainless steel film with equal thickness and made of stainless steel by etching, and then a copper film made of copper may be formed as the third sub-functional layer 3021 in the second groove 305 by bonding and sputtering. The thickness of the stainless steel film layer may range from 20 μm to 50 μm, and the thickness of the fourth sub-functional layer 3022 may range from 10 μm to 30 μm, that is, the thickness of the first functional part 301 in FIG. 7 may be 20 μm to 50 μm. The photosensitive device 40 and the fixing layer 50 may be arranged near the same end of the display panel 100. Furthermore, as shown in FIG. 12, the second groove 305 formed on one side of the stainless steel film layer may be arranged at least opposite to the part of the display panel 100 except for the photosensitive device 40 and the fixing layer 50, and the same first functional part 301 may be formed at the same time to be arranged opposite to the photosensitive device 40 and the fixing layer 50.

Certainly, as shown in FIGS. 2 and 3, the first functional part 301 and the second functional part 302 may be made of the same composition material. Furthermore, the side of the first functional part 301 and the side of the second functional part 302 with the same thickness may be connected by hot melt adhesive to form the functional layer 30 with uniform thickness.

Figure 13:
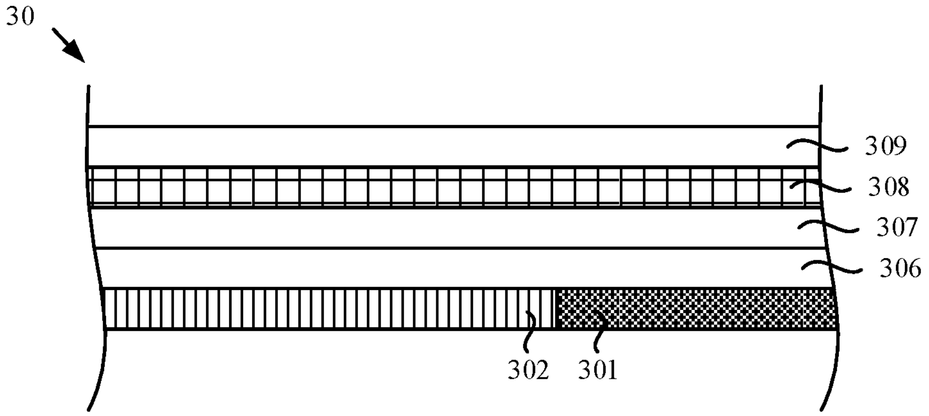
FIG. 13 is a diagram illustrating a cross-sectional view of a functional layer according to the embodiment of the present application.

Specifically, as shown in FIG. 13, the functional layer 30 may further include an adhesive layer 306 on the first functional part 301 and the second functional part 302, a flexible layer 307 on the adhesive layer 306, a foam layer 308 on the flexible layer 307, and a grid adhesive layer 309 on the foam layer 308. The adhesive layer 306 may include but not limited to a pressure-sensitive adhesive. The flexible layer 307 can include but not limited to polyimide, the foam layer 308 may be foam, and the grid adhesive layer 309 may be made of glass woven mesh cloth as the base composition material and coated with dry adhesive emulsion. It may be understood that the first functional part 301 and the second functional part 302 can enhance the hardness and function of the functional layer 30 and shield the electromagnetic field. The flexible layer 307 can improve the mechanical properties of the functional layer 30, the foam layer 308 has a buffering function, and the grid adhesive layer 309 can shield the light and remove the gas between the film layers. Furthermore, the side of the adhesive layer 306 away from the flexible layer 307 may be provided with a graphite layer to homogenize the heat of the functional layer 30 to prevent the heat concentration.

The present application provides a display panel which includes: a substrate including a display region, wherein the display region includes a deformation sub-region and a normal sub-region; a light-emitting layer located at one side of the substrate opposite to the display region; and a functional layer located at the side of the substrate away from the light-emitting layer, and including a first functional part arranged opposite to the deformation sub-region and a second functional part arranged opposite to the normal sub-region. The elastic modulus of the first functional part is greater than that of the second functional part. In the present application, with the elastic modulus of the first functional part greater than that of the second functional part, under same stress, the strain of the first functional part is less than that of the second functional part to produce less deformation, so as to improve the deformation of the functional layer caused by external force, thereby improving the appearance of the screen of the display panel.

The display panel provided by the above embodiments of this application is introduced as the above in details. In the present application, specific examples are used to explain the principle and implementation of this application. The explanations of the above embodiments are only used to help understand the technical scheme and core ideas of the present application. Those skilled in the art should understand that they can still modify the technical solutions described in the previous embodiments, or equivalently replace some of the technical features. These modifications or substitutions do not make the essence of the corresponding technical solutions depart from the scope of the technical solutions of the embodiments of this application.

What is claimed is:

1. A display panel, comprising:

a substrate comprising a display region, wherein the display region comprises a deformation sub-region and a normal sub-region;

a light-emitting layer located at one side of the substrate opposite to the display region; and a functional layer located at a side of the substrate away from the light-emitting layer and comprising a first functional part arranged opposite to the deformation sub-region and a second functional part arranged opposite to the normal sub-region;

wherein an elastic modulus of the first functional part is greater than that of the second functional part;

wherein the functional layer comprises:

a first functional layer arranged at least opposite to the display region and comprising a first groove arranged opposite to the deformation sub-region; and a second functional layer filled in the first groove, an elastic modulus of the second functional layer being greater than that of the first functional layer;

wherein the first functional part comprises a part of the first functional layer corresponding to the deformation sub-region, and the second functional layer that are arranged in a laminated manner; and wherein the first functional layer comprises at least one of copper or aluminum, and the second functional layer comprises at least one of stainless steel and carbon fiber.

2. The display panel of claim 1, wherein a thickness of a part of the first functional layer opposite to the normal sub-region is greater than or equal to a thickness of the second functional layer.

3. The display panel of claim 2, wherein the thickness of the part of the first functional layer opposite to the normal sub-region ranges from 30 microns (μm) to 50 μm, and the thickness of the second functional layer ranges from 15 μm to 30 μm.

4. The display panel of claim 1, wherein the first functional layer is arranged opposite to the normal sub-region, and the second functional layer is arranged at least opposite to the display region and comprises a second groove arranged opposite to the normal sub-region, wherein the second groove is filled with the first functional layer, and the elastic modulus of the second functional layer is greater than that of the first functional layer;

wherein the second functional part comprises a part of the first functional layer corresponding to the normal sub-region, and the second functional layer that are arranged in a laminated manner.

5. The display panel of claim 4, wherein a thickness of a part of the second functional layer opposite to the deformation sub-region is greater than that of the first functional layer.

6. The display panel of claim 1, wherein the first functional part defines a first through hole.

7. The display panel of claim 1, wherein the substrate further comprises a non-display region comprising a bent sub-region and a terminal sub-region arranged in the bent sub-region and away from the display region, the terminal sub-region is fixed on a side of the functional layer away from the light-emitting layer through the bent sub-region, and the bent sub-region overlaps the deformation sub-region.

8. A display panel, comprising:

a substrate comprising a display region, wherein the display region comprises a deformation sub-region and a normal sub-region;

a light-emitting layer located at one side of the substrate opposite to the display region; and a functional layer located at a side of the substrate away from the light-emitting layer and comprising a first functional part arranged opposite to the deformation sub-region and a second functional part arranged opposite to the normal sub-region;

wherein an elastic modulus of the first functional part is greater than that of the second functional part;

wherein the functional layer comprises:

a first functional layer arranged opposite to the normal sub-region; and a second functional layer arranged at least opposite to the display region and comprising a second groove arranged opposite to the normal sub-region, wherein the second groove is filled with the first functional layer, and an elastic modulus of the second functional layer is greater than that of the first functional layer;

wherein the second functional part comprises a part of the first functional layer corresponding to the normal sub-region, and the second functional layer that are arranged in a laminated manner; and wherein the first functional layer comprises at least one of copper or aluminum, and the second functional layer comprises at least one of stainless steel and carbon fiber.

9. A display panel, comprising:

a substrate comprising a display region, wherein the display region comprises a deformation sub-region and a normal sub-region;

a light-emitting layer located at one side of the substrate opposite to the display region; and a functional layer located at a side of the substrate away from the light-emitting layer and comprising a first functional part arranged opposite to the deformation sub-region and a second functional part arranged opposite to the normal sub-region;

wherein an elastic modulus of the first functional part is greater than that of the second functional part, wherein the elastic modulus of the first functional part is greater than or equal to 100 gigapascals (GPa).

10. The display panel of claim 9, wherein the functional layer comprises:

a first functional layer arranged at least opposite to the display region and comprising a first groove arranged opposite to the deformation sub-region; and a second functional layer filled in the first groove, an elastic modulus of the second functional layer being greater than that of the first functional layer;

wherein the first functional part comprises a part of the first functional layer corresponding to the deformation sub-region, and the second functional layer that are arranged in a laminated manner.

11. The display panel of claim 10, wherein a thickness of the part of the first functional layer opposite to the normal sub-region is greater than or equal to a thickness of the second functional layer.

12. The display panel of claim 11, wherein the thickness of the part of the first functional layer opposite to the normal sub-region ranges from 30 microns (μm) to 50 μm, and the thickness of the second functional layer ranges from 15 μm to 30 μm.

13. The display panel of claim 9, wherein the functional layer comprises:

a first functional layer arranged opposite to the normal sub-region; and a second functional layer arranged at least opposite to the display region and comprising a second groove arranged opposite to the normal sub-region, wherein the second groove is filled with the first functional layer, and the elastic modulus of the second functional layer is greater than that of the first functional layer;

wherein the second functional part comprises a part of the first functional layer corresponding to the normal sub-region, and the second functional layer that are arranged in a laminated manner.

14. The display panel as claimed in claim 13, wherein a thickness of the second functional layer opposite to the deformation sub-region is greater than that of the first functional layer.

15. The display panel as claimed in claim 14, wherein the thickness of the second functional layer opposite to the deformation sub-region ranges from 20 μm to 50 μm, and a thickness of the first functional layer ranges from 10 μm to 30 μm.

16. The display panel of claim 9, wherein the first functional layer comprises a composition material comprising at least one of copper or aluminum, and a composition material of second functional layer comprises at least one of stainless steel or carbon fiber.

17. The display panel of claim 9, wherein the first functional part defines a first through hole.

18. The display panel of claim 9, wherein the substrate further comprises a non-display region comprising a bent sub-region and a terminal sub-region arranged in the bent sub-region and away from the display region, and the terminal sub-region is fixed on a side of the functional layer away from the light-emitting layer through the bent sub-region, and the bent sub-region overlaps the deformation sub-region.

19. The display panel of claim 9, wherein thermal conductivity of the second functional part is greater than 200 watts/meter degrees.

* * * * *